United States Patent [19]

Muënz

[11] 3,997,411
[45] Dec. 14, 1976

[54] METHOD FOR THE PRODUCTION OF A THIN FILM ELECTRIC CIRCUIT

[75] Inventor: Wolf-Dieter Muënz, Unterhaching, Germany

[73] Assignee: Siemens Aktiengesellschaft, Berlin & Munich, Germany

[22] Filed: Jan. 22, 1975

[21] Appl. No.: 543,140

Related U.S. Application Data

[62] Division of Ser. No. 480,826, June 19, 1974, Pat. No. 3,949,275.

[30] Foreign Application Priority Data

June 20, 1973 Germany ............................ 2331586

[52] U.S. Cl. ................................. 204/15; 156/7; 427/96
[51] Int. Cl.² ........................................... C25D 5/02
[58] Field of Search .................. 204/15, 192; 156/7; 427/88–90, 96, 79

[56] References Cited
UNITED STATES PATENTS

| | | | |
|---|---|---|---|
| 3,386,011 | 5/1968 | Murray, Jr. et al. | 204/15 |
| 3,387,952 | 6/1968 | La Chapelle | 204/15 |
| 3,607,679 | 9/1971 | Melroy | 204/15 |

*Primary Examiner*—T. M. Tufariello
*Attorney, Agent, or Firm*—Hill, Gross, Simpson, Van Santen, Steadman, Chiara & Simpson

[57] ABSTRACT

Method for the production of an electric thin-film circuit having a conductor path and at least one capacitor and/or one resistor, and comprising a substrate base member and the forming of a first tantalum-aluminum-alloy layer thereupon and etching the tantalum-aluminum-alloy layer to form the outline of the conductor path. A second tantalum-aluminum alloy layer is then laid on the first tantalum-aluminum-alloy layer and has a tantalum content of approximately 2 through 20 atomic percent at least in the area of the capacitor. An oxidation layer is formed upon the second tantalum-aluminum-alloy layer to constitute the capacitor dielectric. The conductor paths and the opposite capacitor electrode are formed of a conductive layer such as a nickel-chromium-gold layer which is applied as a surface layer and serves as a capacitor electrode and as conductor paths.

16 Claims, 12 Drawing Figures

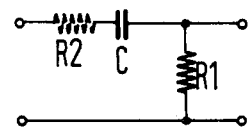
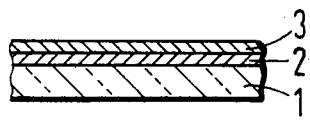
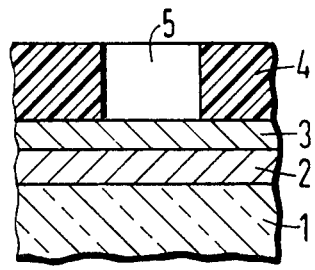
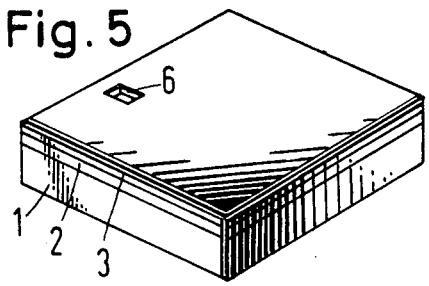
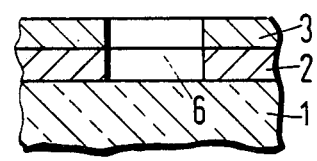
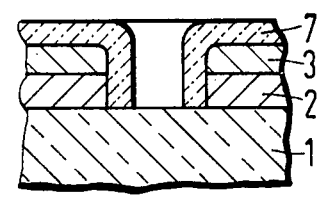
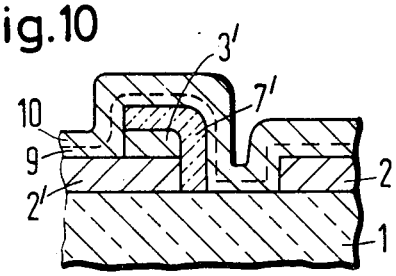
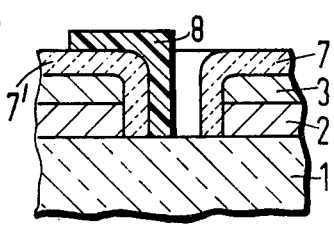
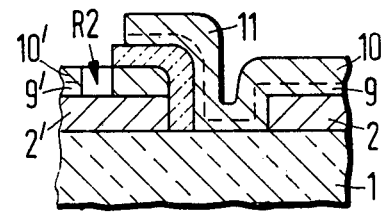
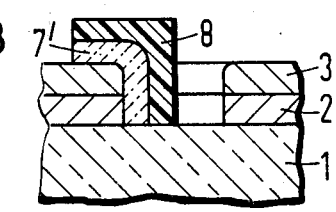
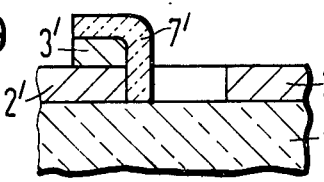
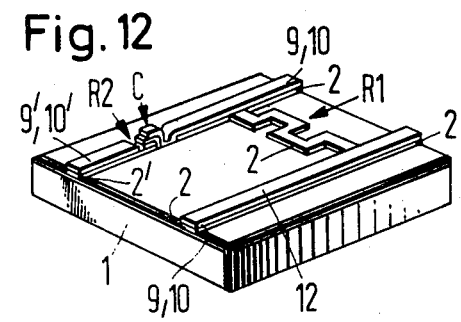

METHOD FOR THE PRODUCTION OF A THIN FILM ELECTRIC CIRCUIT

This is a division, of application Ser. No. 480,826, filed June 19, 1974 now U.S. Pat. No. 3949,275.

BACKGROUND OF THE INVENTION

1. Field of the Invention

The invention is directed to an electric thin-film circuit and a method for its production, including the steps of applying various thin films, forming the circuit, and selectively etching the components from these thin films.

2. Prior Art

The U.S. Pat. application Ser. No. 408,100 of Oct. 19, 1973 explains in detail that tantalum-aluminum alloys are well suited for electric thin-film circuits disposed upon a substrate made of an insulator material, and that particularly favorable electric values are obtained in view of temperature coefficients and the time constancy, when the tantalum content is relatively low, compared with the aluminum content, for instance in the range between 2 and 20 atomic percent.

It was stressed in this application that the aluminum forms a so-called face-centered cubic lattice (fcc lattice), in the case of a tantalum content of approximately 7 atomic percent or less, instead of forming a tetragonal lattice as this is the case with a higher tantalum content. The fcc lattice entails a great time stability of the finished electric components which were produced in accordance with this tantalum-aluminum thin-film technique.

The present invention proceeds from this suggestion and provides a method permitting the construction of a thin-film circuit in the tantalum-aluminum technique, comprising a capacitor and at least one conductor path and or at least one resistor, whereby the tantalum-aluminum oxide layer forming the capacitor dielectric is produced as independently as possible from the conductor path or the resistor path, in order to minimize production tolerances.

SUMMARY OF THE INVENTION

It has been found desirable to provide an electric thin-film circuit of the initially mentioned kind whereby the basic electrode, at least in the area of a capacitor, consists of two layers of tantalum-aluminum alloys with differing tantalum contents, whereby the layer with the higher tantalum content is placed directly onto the substrate, and the other one thereupon. The layer with the lower tantalum content oxidizes to form the capacitor dielectric, and this oxidation layer is provided with the opposite capacitor electrode, consisting preferably of a nickel-chromium-gold layer. This material may also be used for the conductor paths, whereby it is placed upon the layer with the higher tantalum content. It is also advantageous when the resistors are formed of the layer with the higher tantalum content.

In accordance with a preferred method for the production of such thin-film circuits, the substrate is first provided with the tantalum-aluminum-alloy having the higher tantalum content, for instance between 30 and 70 atomic percent, in particular approximately 50 atomic percent. The second tantalum-aluminum layer having the lower tantalum content, for instance between 2 and 20 atomic percent is applied onto the first layer, for instance by a way of cathode sputtering. Then, prior-art masking and etching techniques are used to interrupt both layers in places where capacitors are to be formed. After the removal of the first etching mask, a tantalum-aluminum-oxide layer is produced by way of an anodic oxidation. The portions of this tantalum-aluminum-oxide layer, which are to be used for the capacitor formation, and then covered by a further mask. The remaining portions are first freed from the tantalum-aluminum oxide and then from the layer having the lower tantalum content. After the residual mask portions have been removed, a good conductor is applied as a surface layer, for instance a nickel-chromium-gold layer. This layer serves as capacitor electrode and possibly as conductor paths. If resistors are present, they are produced from the tantalum-aluminum layer with the higher tantalum content.

It is recommended to carry out the anodic oxidation of the tantalum-aluminum layer while using a weak acid such as a diluted citric-acid solution. The process is preferably continued by using a current density in the order between 0.1 and 1.0 mA/cm$^2$ until a forming potential in the order of several hundred volts is obtained, in particular in the area around 500 volts. An electrolyte containing hydroflouric acid, for instance a diluted solution of hydroflouric acid and nitric acid, are suited for etching the tantalum-aluminum-oxide layer. A diluted cerium-sulfate solution or a diluted hydrochloric-acid solution or a diluted caustic-soda solution are suited for etching the tantalum-aluminum layer with the lower tantalum content. A diluted solution containing hydrofluoric acid and nitric acid is recommended for etching the tantalum-aluminum layer with the higher tantalum content. The above etching agents will operate at room temperature.

BRIEF DESCRIPTION OF THE DRAWING

In the drawings, which are not drawn to size, like reference characters indicate like or corresponding parts:

FIG. 1 is a diagram of a circuit produced in accordance with this invention,

FIG. 2 is a partial cross-sectional view of the circuit after the application of the two tantalum-aluminum layers, FIG. 3 is a partial cross-sectional view of the arrangement in FIG. 2, after the application and exposure of the photo mask, FIG. 4 is a partial cross-sectional view of the arrangement of FIG. 3, after the etching process, and the removal of the photo mask, FIG. 5 is a perspective view of the arrangement of FIG. 4, FIG. 6 is a partial cross-sectional view of the arrangement of FIG. 4, after the oxidation process.

FIG. 7 is a partial cross-sectional view of the arrangement after the application of a second photo mask defining the capacitor shape, FIG. 8 is a partial cross-sectional view of the parts of the arrangement of FIG. 7 which remain after the etching process, of the tantalum-aluminum-oxide layer, FIG. 9 is a partial cross-sectional view of the arrangement after the etching process of the second tantalum-aluminum layer has been carried out and the photo mask has been removed.

FIG. 10 is a partial cross-sectional view of the arrangement after the application of the conductive layer, FIG. 11 is a partial cross-sectional view of the arrangement after a further etching process has been carried out to form the conductors or resistors, and FIG. 12 is a perspective view of the finished circuit shown in FIG. 1.

DESCRIPTION OF PREFERRED EMBODIMENTS

The figures of this application explain a preferred embodiment of a circuit in accordance with the invention. Thereby, the longitudinal branch of a four terminal arrangement comprises a capacitor C. A resistor R2 may be arranged in series therewith, while a further resistor R1 is placed in the cross branch. The following figures explain a preferred method of production of the circuit in accordance with FIG. 1.

FIG. 2 shows a substrate 1 made of an insulating material such as glass, quartz, sapphire or polished fine-grain ceramic which is first provided with a tantalum-aluminum-alloy layer 2 having a tantalum content between 30 and 70 atomic percent, preferably approximately 50 atomic percent. This layer is applied in a prior art manner, for instance by cathode sputtering. A further tantalum-aluminum-alloy layer 3 is applied onto the previous one 2, but this layer 3 has a relatively lower tantalum content in the order between 2 and 20 atomic percent.

The above substrate is now covered by a photo mask 4 which is exposed and developed to leave an opening for the later capacitor formation, for instance at the point 5. Thus, the tantalum-aluminum layer 3 is exposed at this point 5, as shown in FIG. 3. During an etching process, both tantalum-aluminum layers 2 and 3 are removed in the area of the opening 5, forming the opening 6 exposing the substrate 1, as shown in FIGS. 4 and 5. In these figures, the photo mask 4 had been previously removed.

FIG. 6 shows a layer 7 of tantalum-aluminum oxide formed by an anodic oxidation of the surface of layer 3 and of the frontal surfaces of both tantalum-aluminum layers 2 and 3.

In the above arrangement, the tantalum-aluminum layer 2 has an approximate thickness of a few tenths of a micrometer, the tantalum-aluminum layer 3 has a thickness of approximately 1 micrometer, and the substrate 1 is approximately 0.6 mm thick. The tantalum-aluminum-oxide layer 7, which is shown in FIG. 6, is produced by an anodic oxidation carried out with a constant current source. It is made so thick that a potential difference in the order of several 100 volts, preferably up to 500 volts, is produced between the free side of the layer 7 and the tantalum-aluminum layers 2 and 3 upon substrate 1, if 0.1 through 1 mA/cm$^2$ are applied. It is not advisable to exceed the above voltage since breakthroughs through the tantalum-aluminum-oxide layer cannot always be avoided at the present time. However, this value does result in a relatively high voltage strength, as compared with the capacitor dielectrics formed of prior-art tantalum-aluminum-oxide layers.

Next, the substrate 1 and the layers 2, 3, as well as the tantalum-aluminum-oxide layer 7 are cleaned and provided with a further photo mask 8, as shown in FIG. 7. This photo mask 8 fixes the area where the tantalum-aluminum oxide is to be retained to form the capacitor dielectric. The application of this photo mask 8 is well known in the art. In the following etching process, the tantalum-aluminum-oxide which is not covered by the mask 8 is removed, so that only the tantalum-aluminum-oxide area 7' shown in FIG. 8 will remain to form the dielectric. The etching mask 8 is also used in the next etching process, whereby the three areas of the tantalum-aluminum layer 3 with the relatively lower tantalum content are removed. Hereby, the layer 2 is not attacked because the layer 3 can be etched 5 through 20 times faster than the layer 2, due to the differing tantalum content. It is thus possible to obtain the shape shown in FIG. 9 with high precision. After the removal of the photo mask 8, the areas 2 and 2' of the tantalum-aluminum alloy with the higher aluminum content will remain.

It is shown in FIG. 9, the tantalum-aluminum layer 2' in the area of the capacitor will now be covered by the residual portion 3' of the tantalum-aluminum alloy with the lower tantalum content, and the frontal ends of both tantalum-oxide layers 2' and 3' as well as the upper portions of the layer 3' are still covered by the tantalum-aluminum-oxide film 7' which has a thickness in the order of a some tenths of a micrometer and serves as a capacitor dieletric.

The remaining production of the capacitor is in accordance with the prior art. The parts of the cleaned substrate which support one or several of layers 2, 2', 3' and 7' are now covered with a nickel-chromium-gold layer, for instance by successively evaporating a nickel-chromium layer 9 and a gold layer 10. The thickness of this combined nickel-chromium-gold layer 9, 10 is usually in the order of a few tenths of a micrometer. Such an embodiment is shown in FIG. 10. A further photo mask is used to cover the portion 11 of the nickel-chromium-gold layer 9, 10, which is required to form the conductor paths and the opposite electrode of the capacitor. The remaining portions of the nickel-chromium-gold layer 9, 10 are etched away in a prior-art manner, for instance with the help of a solution containing potassium-iodide and iodine solution for the gold and a diluted cerium-sulfate solution for the nickel-chromium portion. Then, prior art masking and etching techniques are used to produce the resistor R1. This resistor R1 is formed by layer 2 and it may be shaped as shown in FIG. 12.

If an additional resistor R2 is to be introduced (as indicated by interrupted lines in FIG. 1) in series with the capacitor, as shown in FIG. 11, this may be done by etching away more of the nickel-chromium-gold layer upon the tantalum-aluminum layer 2'. In this case, the portions 9, 10 and 9', 10' will remain which bridge the highly resistive tantalum-aluminum alloy whereby the layer 2' may be made to have a different shape to obtain different resistance values, for instance in the shape of a meander.

FIG. 12 shows the circuit designed in FIG. 1 in a perspective view, whereby the portions 10, 10' correspond to the like numbered portions of FIG. 11. In addition to the features of FIG. 11, the continuous conductor path 12 and the resistor path R1 are shown, whereby the resistor path R1 merges directly into the layers 2 of section 9, 10 and 12. The resistor layer of R1 and R2 consists of the tantalum-aluminum alloy with the relatively high tantalum content. The nickel-chromium gold layers supplement the tantalum-aluminum layer with the higher tantalum content to form conductor sections 9, 10 and 12 which have a high conductivity.

In accordance with another embodiment of this invention, it is possible to produce the conductor structure and the resistor structure directly from the substrate 1 with the two tantalum-aluminum-alloy layers 2 and 3, as shown in FIG. 5, whereby corresponding masks and etching process are applied. In this case, the capacitor is only formed in the area around location 6, while using further masks, and the anodic oxidation process which was explained with the help of FIG. 6 through 11.

It will be apparent from the above description of the preferred embodiments that this invention provides a simple, practical and effective thin-film circuit and a method for its production. Although there may be variations and modifications made by those skilled in the art, it is desired to include them within the scope of the invention as defined in the appended claims.

What is claimed is:

1. Method for the production of a thin-film circuit, comprising the steps of:
    applying a first tantalum-aluminum alloy layer with a tantalum content between 30 and 70 atomic percent onto a substrate,
    applying a second tantalum-aluminum alloy layer with a tantalum content between 2 and 20 atomic percent to said first alloy layer, and thereby providing a double tantalum-aluminum layer of different tantalum contents,
    etching the second alloy layer in a predetermined area by a masking and etching technique which etches said second alloy layer without etching said first alloy layer,
    producing an interruption in the first alloy layer in a predetermined area by masking and etching techniques,
    anodically oxidizing the second tantalum-aluminum alloy layer to form a capacitor dielectric,
    applying a conductive material to the remaining parts of the first alloy layer to define a conductive path, and
    applying a conductive material to the tantalum-aluminum oxide layer to define a capacitor electrode.

2. Method in accordance with claim 1, whereby the tantalum-aluminum layers are applied by cathode sputtering.

3. Method in accordance with claim 1, whereby the conductive material is a nickel-chromium-gold layer.

4. Method in accordance with claim 1, whereby resistors are produced by etching away the second tantalum-aluminum layer and leaving the first tantalum aluminum layer.

5. Method in accordance with claim 4, whereby particular resistance values are obtained by corresponding shapes of resistors.

6. Method in accordance with claim 1, whereby the anodic oxidation is carried out by applying a weakly diluted acid such as a citric-acid solution.

7. Method in accordance with claim 1, whereby the anodic oxidation is carried out by using a current density in the order between 0.1 and 1.0 mA/cm$^2$.

8. Method in accordance with claim 1, whereby the anodic oxidation is continued until a forming voltage in the order of several hundred volts is obtained.

9. Method in accordance with claim 8, whereby the forming voltage is in the order of 500 volts.

10. Method in accordance with claim 1, whereby the oxide layer on the second tantalum-aluminum layer is etched with an electrolyte containing hydrofluoric acid.

11. Method in accordance with claim 10, whereby the second tantalum-aluminum layer is etched with a diluted solution containing hydrofluoric acid and nitric acid.

12. Method in accordance with claim 1, whereby the first tantalum-aluminum layer is etched with a diluted cerium-sulfate solution.

13. Method in accordance with claim 1, whereby a the first tantalum aluminum layer is etched with a diluted hydrochloric-acid solution.

14. Method in accordance with claim 1, whereby the first tantalum-aluminum layer is etched with a diluted caustic-soda solution.

15. Method in accordance with claim 1, whereby the first tantalum aluminum layer is etched with a diluted solution containing hydrofluoric acid and nitric acid.

16. Method in accordance with claim 1, whereby the conductive material is etched with a solution containing potassium-iodide and iodine to form resistors and to define the capacitor.

* * * * *